(12) United States Patent
Oshima

(10) Patent No.: US 8,026,175 B2
(45) Date of Patent: Sep. 27, 2011

(54) CLEANING APPARATUS OF SEMICONDUCTOR SUBSTRATE AND METHOD OF MANUFACTURING SEMICONDUCTOR DEVICE

(75) Inventor: Tadashi Oshima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 839 days.

(21) Appl. No.: 11/475,995

(22) Filed: Jun. 28, 2006

(65) Prior Publication Data

US 2007/0232073 A1 Oct. 4, 2007

(30) Foreign Application Priority Data

Mar. 29, 2006 (JP) .................. 2006-091352

(51) Int. Cl.
*H01L 21/302* (2006.01)
*H01L 21/461* (2006.01)

(52) U.S. Cl. . 438/689; 438/745; 438/748; 257/E21.174; 257/E21.214; 257/E21.277

(58) Field of Classification Search .................. 438/689, 438/745, 748; 257/E21.174, E21.214, E21.273, 257/E21.277; 134/26, 102.2, 102.3, 103.2
See application file for complete search history.

(56) References Cited

U.S. PATENT DOCUMENTS

| 5,487,398 A * | 1/1996 | Ohmi et al. ............... 134/95.1 |
| 6,740,602 B1 * | 5/2004 | Hendriks et al. .......... 438/780 |
| 2001/0004878 A1 * | 6/2001 | Sakai et al. ............... 118/70 |
| 2004/0195365 A1 * | 10/2004 | Wu .......................... 239/270 |
| 2006/0234503 A1 * | 10/2006 | Yamada et al. ........... 438/667 |
| 2007/0175501 A1 * | 8/2007 | Amai et al. .............. 134/149 |

FOREIGN PATENT DOCUMENTS

| JP | 11-74179 A | 3/1999 |
| JP | 2001-232250 A | 8/2001 |
| JP | 2003-203892 A | 7/2003 |
| JP | 2004-337858 A | 12/2004 |
| JP | 2005-167261 A | 6/2005 |

OTHER PUBLICATIONS

Japanese Office Action for Japanese Application No. 2006-091352 mailed on Sep. 14, 2010. A partial English-language translation is provided.

* cited by examiner

*Primary Examiner* — Charles Garber
*Assistant Examiner* — Abdulfattah Mustapha
(74) *Attorney, Agent, or Firm* — Fujitsu Patent Center

(57) ABSTRACT

After a liquid chemical treatment is finished, in parallel with a washing away treatment and/or a drying treatment, by spraying from a nozzle for a cleaning liquid supplied by a cleaning line to an outer surface of a nozzle for a liquid chemical, crystals and the like of components of the liquid chemical adhered on the outer surface of the nozzle are removed. In the cleaning treatment, a spraying time of the cleaning liquid is five seconds to ten seconds. In addition, the components of the cleaning liquid is not specifically limited, however, since ammonium phosphate tends to be solved in purified water, if a liquid chemical containing ammonium phosphate is used, it is preferable to use purified water as the cleaning liquid. Depending on the components and the like of the liquid chemical, a solution that can solve the crystals and the like may be used in stead.

11 Claims, 15 Drawing Sheets

CLEANING APPARATUS OF SEMICONDUCTOR SUBSTRATE AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2006-091352, filed on Mar. 29, 2006, the entire contents of which are incorporated herein by reference.

BACKGROUND OF THE INVENTION

1. Field of the Invention

The present invention relates to a cleaning apparatus of a semiconductor substrate and a method of manufacturing a semiconductor device which are suitable for manufacturing a semiconductor device using a large diameter substrate.

2. Description of the Related Art

Recently, as a semiconductor device is more highly integrated, a gate width of the semiconductor device has been narrower, while maintaining the height of a gate electrode. As a result, the aspect ratio of the gate electrode has been larger. Moreover, a gap of metal wirings has also been narrower. Further, in order to reduce a capacitance between the wirings, a low dielectric constant film is often used as an interlayer insulating film. Moreover, in order to suppress wiring resistance to a low value, a copper wiring is employed, and the semiconductor device is designed to have a higher height by an amount corresponding to the width decrease. Thus the aspect ratio of the copper wiring has also been larger.

When the copper wiring is formed, a damascene method is employed. In the damascene method, after formed wiring grooves by using a dry etching process in an interlayer insulating film such as a low dielectric constant film, the copper wiring is buried in the wiring grooves. In addition, after the dry etching process is finished, in order to remove adhered matters such as copper oxide, fluorine compound, organic polymer, and inorganic polymer, a wet post-treatment is implemented as cleaning. In the cleaning, an ammonium fluoride-based liquid chemical, or an ammonium phosphate-based liquid chemical is used. The above-mentioned liquid chemicals are preferable for working environment and for safety, because they do not contain deleterious and poisonous substances, thereby, do not belong to dangerous articles. Moreover, since their organic contents are relatively small, the treatment of their waste liquids is also easy.

Moreover, recently, in order to improve yields, enlargement of the diameter of a semiconductor substrate (wafer) has been advanced. Accordingly, although in cleaning (wet post-treatment) of a semiconductor substrate with a diameter of about 8 inch, a batch-type post-treating apparatus is used, in cleaning of a large diameter semiconductor substrate, a single-wafer-type post-treating apparatus has been used. FIG. 12 is a schematic view showing a conventional single-wafer-type post-treating apparatus. In the conventional single-wafer-type post-treating apparatus, a stage 106 on which a substrate 109 is placed is arranged in a treating bath 105. Moreover, a tank 104 storing a liquid chemical, a pump 103 sucking the liquid chemical from the tank 104, a heater 102 heating the liquid chemical sucked by the pump 103, and a nozzle 101 for the liquid chemical spraying the liquid chemical warmed by the heater 102 to the substrate 109 are also provided. Further, nozzle for water cleaning and the like (not shown) are also provided.

The cleaning using such a single-wafer-type post-treating apparatus, suppresses the increase of the contact resistance of the semiconductor device.

However, with increasing the diameter of the semiconductor substrate and the like, defective products tend to occur.

Related arts are disclosed in Patent document 1 (Japanese Patent Application Laid-open No. 2004-337858), Patent document 2 (Japanese Patent Application Laid-open No. 2001-232250), and Patent document 3 (Japanese Patent Application Laid-open No. Hei 11-74179).

SUMMARY OF THE INVENTION

It is an object of the present invention to provide a cleaning apparatus of a semiconductor substrate and a method of manufacturing a semiconductor device, which, even if a large diameter semiconductor substrate is used, can prevent defective products from occurring.

As a result of energetic investigations, the inventor of the present invention has found that, as shown in FIG. 13, adhered matters 110 occur on the outer surface of the nozzle 101 from a liquid scattered by the cleaning of the substrate 109, and drop on the substrate 109 to deform a low dielectric constant film; it is the cause of the tendency of defective products to occur. Due to the deformation of the low dielectric constant film used as the interlayer insulating film, the shortage and the breakage of the wiring tend to occur.

During repeated cleaning of the substrates 109 using a post-treating liquid chemical containing ammonium phosphate, ammonium fluoride or the like, crystals precipitate from the scattered liquid, thereby, resulting in the increase of the adhered matters 110. Even in such a situation, in a single-wafer-type post-treating apparatus for an eight-inch substrate, a problem due to the drop of the adhered matters 110 has not been known. However, in case of a single-wafer-type post-treating apparatus for a substrate having a large diameter of 300 mm or more, the traversing distance of the nozzle 101 is larger, and the arm for supporting the nozzle 101 is also heavier. Therefore, the nozzle 101 tends to vibrate largely, thereby resulting in the tendency of the adhered matters 110 to drop. Moreover, the vibration occurring when the substrate 109 is rotated becomes also larger, thereby, also resulting in the drop of the adhered matters 110. Furthermore, the used quantity of the post-treating liquid chemical becomes larger, and the amount of the adhered matters 110 becomes larger.

Further, along with the decrease of the wiring pitch and the increase of the aspect ratio of the wiring, the aspect ratio of the interlayer insulating film located between the copper wirings becomes also larger. Moreover, the strength of the low dielectric constant film is lower as compared with that of a CVD oxide film. In this manner, along with the recent selection of layouts and materials, when the adhered matters drop, the low dielectric constant film tends to deform. FIG. 14A is a photograph by an electron microscope showing deformation of a low dielectric constant film, and FIG. 14B is a schematic view showing the content in FIG. 14A. The patterns shown in FIGS. 14A and 14B are patterns of grooves for forming line and space patterns. A part of the remaining patterns 121 are deformed, neighboring groove patterns 122 are connected each other, and the groove patterns 122 are broken on the way.

As mentioned above, the occurrence and the drop of the adhered matters 110 have not been particularly acknowledged as a problem so far, however, the inventor of the invention of the present application has found that, as a result of overlap of the enlargement of the diameter of the semiconductor substrate, the high aspect ratio of the remaining pattern, and the employment of the low dielectric constant film, the occurrence and the drop of the adhered matters 110 strongly affect the occurrence of the defective products. Especially, the inventor has also found that, if the specific dielectric constant of the low dielectric constant film is 3.0 or less and Young's modulus (film strength) of the low dielectric constant film is 20 GPa or less, the defective products tend to occur.

As a result, the inventor of the present invention has found that the occurrence of the defective products can be prevented by suppressing the drop of the adhered matters or alleviating the impact of the drop.

According to a first aspect of a method of manufacturing a semiconductor device according to the present invention, after a liquid chemical is sprayed from a liquid chemical nozzle to a semiconductor substrate, by spraying a cleaning liquid to materials adhered on the outer surface at a position apart from the semiconductor substrate, the materials are made to remove.

According to a second aspect of a method of manufacturing a semiconductor device according to the present invention, after a liquid film is formed on a surface of a semiconductor substrate, a liquid chemical is sprayed from a liquid chemical nozzle to the semiconductor substrate.

According to a third aspect of a method of manufacturing a semiconductor device according to the present invention, a liquid chemical is sprayed from a nozzle for a liquid chemical to a semiconductor substrate. In addition, a traversing speed of the nozzle for a liquid chemical is limited to 2 cm/second or less.

DETAILED DESCRIPTION OF THE PREFERRED EMBODIMENTS

Hereinafter, referring to the attached drawings, embodiments of the present invention will be specifically described.

First Embodiment

Figure 1:
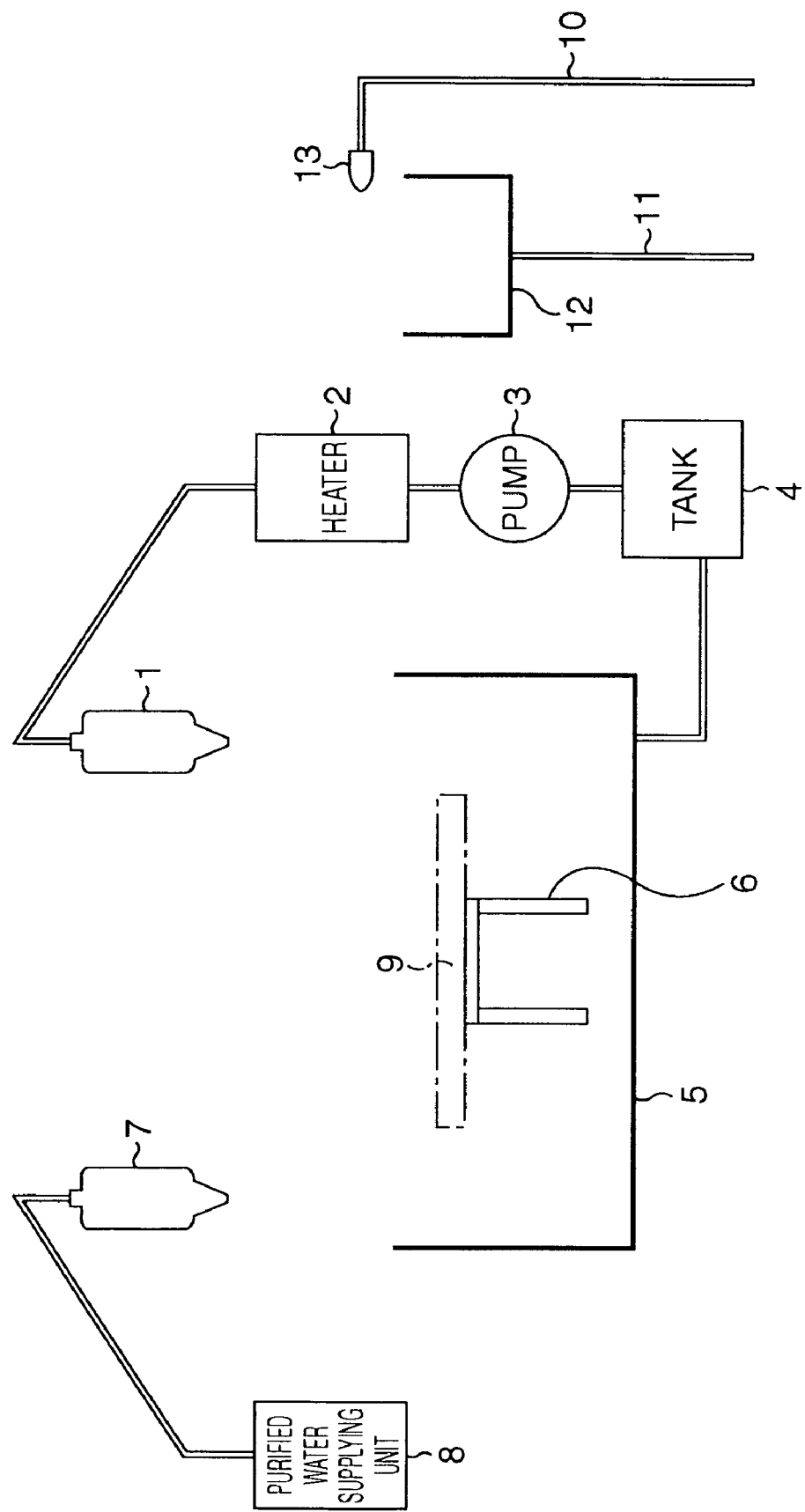
FIG. 1 is a schematic view showing a cleaning apparatus of a semiconductor substrate according to a first embodiment of the present invention.

First, the first embodiment of the present invention will be described. FIG. 1 is a schematic view showing a cleaning apparatus of a semiconductor substrate according to the first embodiment of the present invention.

The cleaning apparatus of a semiconductor substrate according to the present embodiment is used, for example, as a single-wafer-type post-treating apparatus. In the cleaning apparatus, a stage 6 on which a substrate 9 is to be placed is arranged in a treating bath 5. Moreover, there are provided a tank 4 storing a liquid chemical, a pump 3 sucking the liquid chemical from the tank 4, a heater 2 warming the liquid chemical sucked by the pump 3, and a nozzle 1 for the liquid chemical spraying the liquid chemical warmed by the heater 2 to the substrate 9. Moreover, there is also provided a nozzle 7 for purified water spraying purified water supplied from a purified water supplying unit 8 to the substrate 9. Further, a nozzle cleaning bath 12 above which the nozzle 1 is to be moved is arranged apart from the treating bath 5. Moreover, a nozzle 13 spraying a cleaning liquid such as purified water to the outer surface of the nozzle 1 moved above the nozzle cleaning bath 12 is also provided, and a cleaning line 10 is connected to the nozzle 13. Further, a drain line 11 is connected to the nozzle cleaning bath 12.

Figure 2:
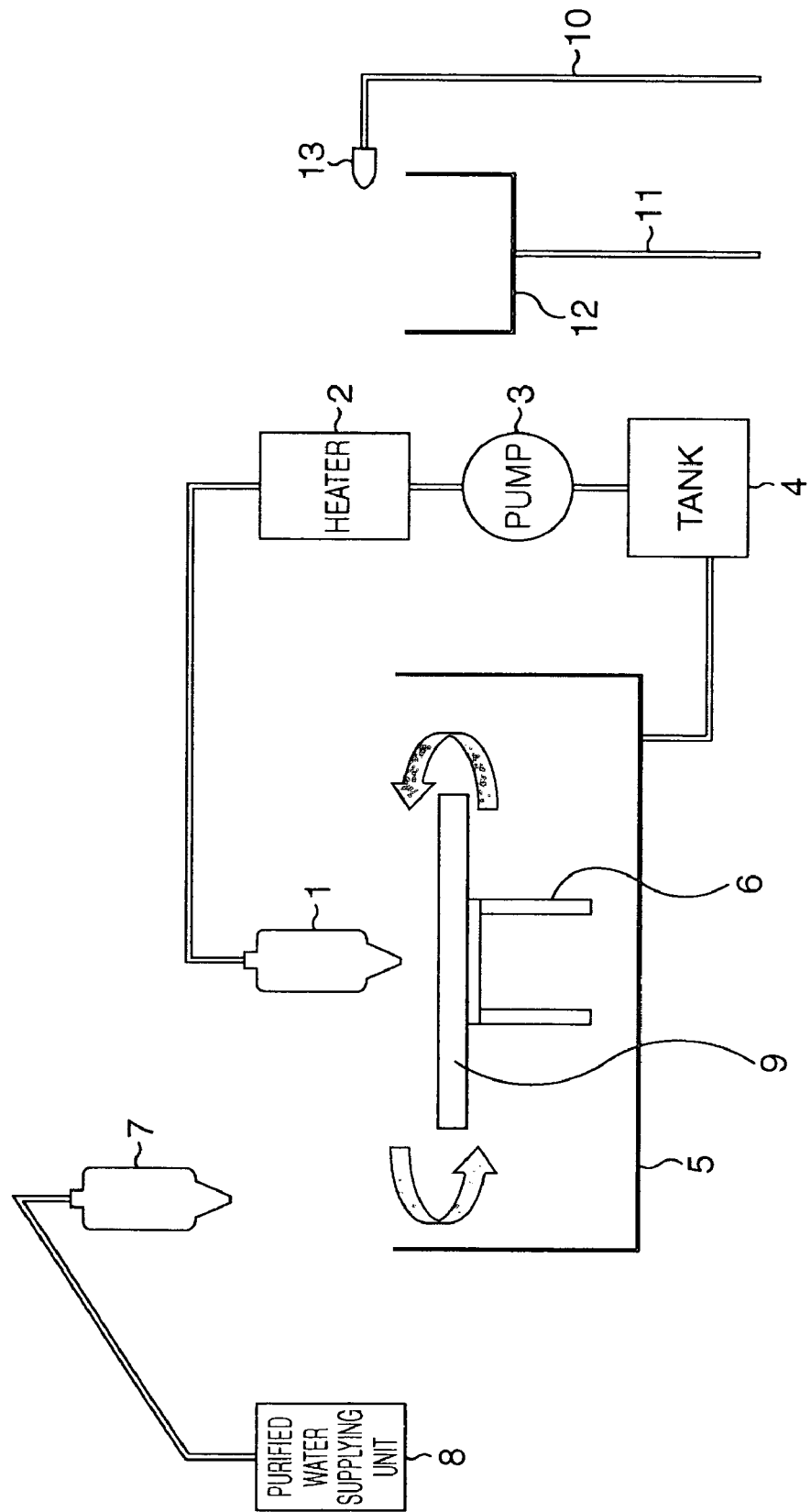
FIG. 2 is a schematic view showing an operation of the cleaning apparatus of a semiconductor substrate according to the first embodiment.
Figure 3:
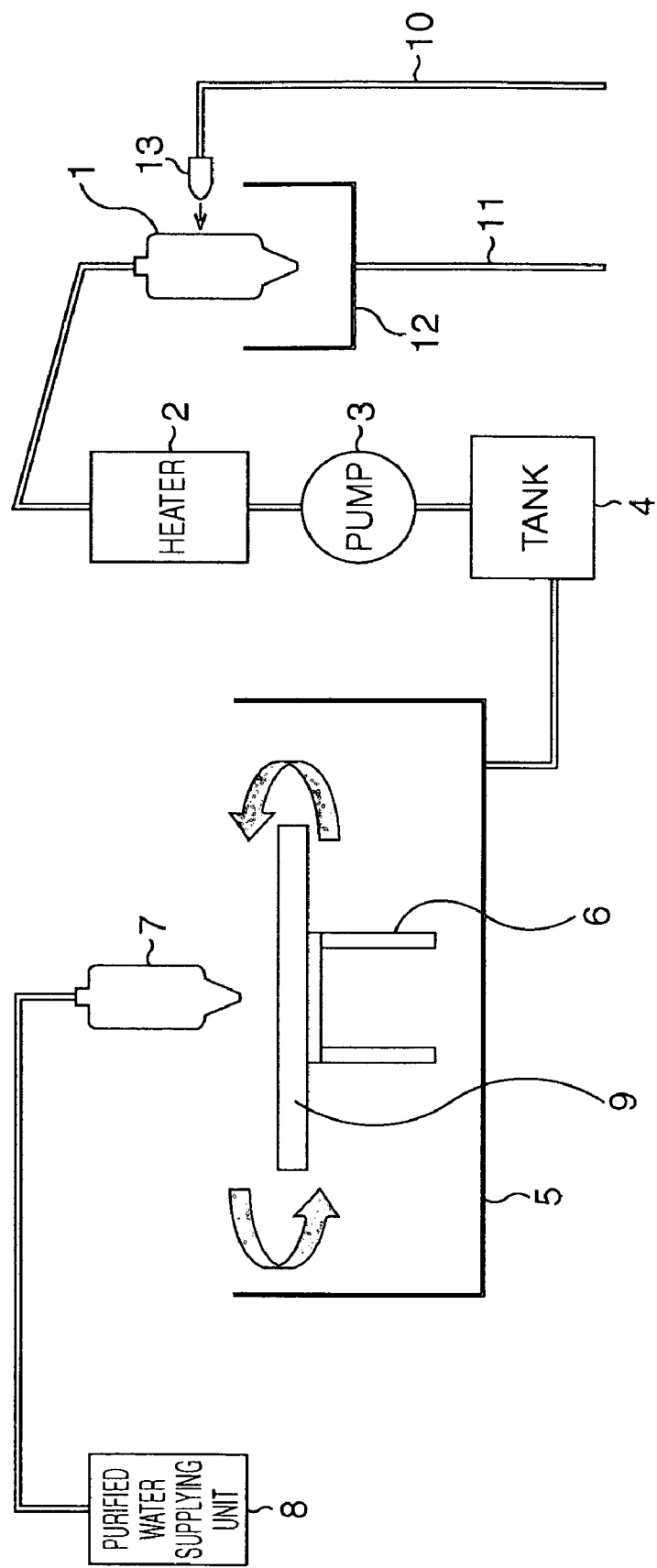
FIG. 3 is a schematic view showing an operation of the cleaning apparatus of a semiconductor substrate following the operation in FIG. 2.

Next, an operation of the cleaning apparatus of a semiconductor substrate configured in the above-mentioned manner will be described together with a cleaning method using the apparatus. FIGS. 2 and 3 are schematic views showing the operation of the cleaning apparatus of a semiconductor substrate according to the first embodiment in the order of steps.

First, as shown in FIG. 2, a substrate 9 to whose insulating film (for example, a low dielectric constant film) dry-etching and the like has been performed is placed on a stage 6. Next, the nozzle 1 for the liquid chemical is moved above the substrate 9. Then, the liquid chemical in the tank 4 for cleaning a substrate is sprayed from the nozzle 1 to the surface of the substrate 9 via the pump 3 and the heater 2, while the substrate 9 is rotated. As the liquid chemical, for example, an ammonium fluoride-based liquid chemical or an ammonium phosphate-based liquid chemical is used. Moreover, a liquid chemical containing one or more species of amines selected from a primary amine to a quaternary amine containing ammonium fluoride or ammonium phosphate may be used instead. In the liquid chemical treatment, for example, a temperature of the liquid chemical is set to 25° C. to 80° C., and a spraying time of the liquid chemical is set to 30 seconds to 180 seconds.

The adhered matters and the like present on the surface of the substrate 9 are removed by the rotation of the substrate 9 and the spraying of the liquid chemical. At this time, as mentioned above, the liquid chemical and the like sprayed to the substrate 9 are scattered on the outer surface of the nozzle 1, thereby, resulting in crystallization of their components.

Next, as shown in FIG. 3, the nozzle 1 for the liquid chemical is moved above the nozzle cleaning bath 12, and the nozzle 7 for purified water is moved above the substrate 9. Then, the purified water is sprayed to the surface of the substrate 9 from the purified water supplying unit 8 via the nozzle 7, while the substrate 9 is rotated. In the water cleaning treatment, for example, a water temperature is set to a room temperature, and a spraying time of the purified water is set to about 60 seconds.

By the rotation of the substrate 9 and the spraying of the purified water, the liquid chemical remaining on the substrate 9 is washed away.

After that, the substrate 9 is dried for about 20 seconds, for example.

Further, in the present embodiment, by spraying the cleaning liquid supplied from the cleaning line 10, from the nozzle 13 to the outer surface of the nozzle 1 for the liquid chemical in parallel, while the water cleaning treatment and/or the drying treatment is/are performed, crystals and the like of the components of the liquid chemical adhered on the outer surface of the nozzle 1 are removed. In the cleaning treatment, a spraying time of the cleaning liquid is set to, for example, five seconds to ten seconds. The component of the cleaning liquid is not limited specifically, however, if a liquid chemical containing ammonium phosphate is used, it is preferable to use purified water, because ammonium phosphate tends to be solved by purified water. Moreover, in stead of the purified water, depending on the components and the like of the liquid chemical, a solution that can solve the crystals and the like of the components may be used.

After the drying of the substrate 9 is finished, the substrate 9 is removed from the stage 6, then, another substrate 9 to be cleaned subsequently is placed on the stage 6. Then, the liquid chemical treatment, the water cleaning treatment and the drying treatment are repeated until the cleanings of all of the substrates 9 are finished. Moreover, every time of finishing the liquid chemical treatment, the outer surface of the nozzle 1 for the liquid chemical is cleaned in an interval until starting the subsequent liquid chemical treatment.

According to the first embodiment, since the outer surface of the nozzle 1 is cleaned every liquid crystal treatments, even if adhered matters occur on the outer surface of the nozzle 1, they are removed until subsequent liquid crystal treatment. Thus, the occurrence of defective products accompanied with the drop of the adhered matters can be suppressed.

Here, a method of manufacturing a semiconductor device including the above-mentioned cleaning treatment will be described. FIGS. 4A to 4E are sectional views showing a first method of manufacturing a semiconductor device in the order of steps.

Figure 4A:
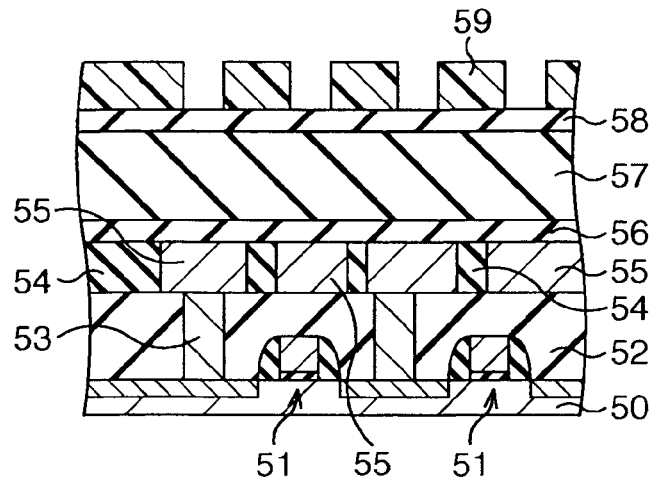
FIGS. 4A to 4E are sectional views showing a first method of manufacturing a semiconductor device in the order of steps.

In the first manufacturing method, first, after an isolation insulating film and a well (not shown in the drawings) are formed on the surface of a semiconductor substrate 50, as shown in FIG. 4A, MOS transistors 51 with a LDD structure are formed. Next, an interlayer insulating film 52 covering the MOS transistors 51 are formed. Then, contact holes extending to the source/drain regions and the like of the MOS transistors 51 are formed in the interlayer insulating film 52, and contact plugs 53 are formed in the contact holes. After that, an insulating film 54 is formed on the interlayer insulating film 52 and the contact plugs 53, and buried wirings 55 is formed in the insulating film 54. Next, insulating films 56, 57 and 58 are sequentially formed on the insulating film 54 and the wirings 55. Then, a resist mask 59 to which a pattern of via-holes is formed is formed on the insulating film 58.

Figure 4B:
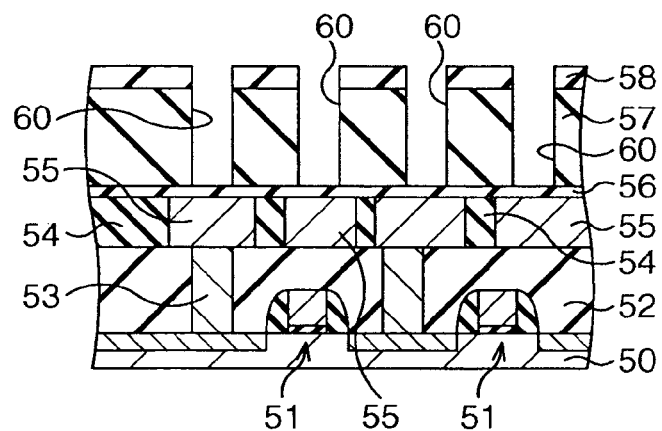

Then, as shown in FIG. 4B, using the resist mask 59 as a mask, and the insulating film 56 as an etching stopper, via-holes 60 are formed by an anisotropic etching of the insulating films 58 and 57. After that, the resist mask 59 is removed by ashing using a gas containing oxygen radicals.

Figure 4C:
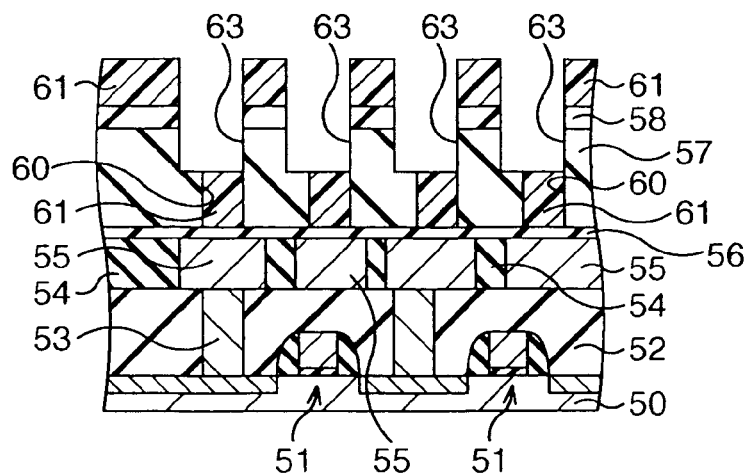

Subsequently, as shown in FIG. 4C, a resist mask 61 to which a pattern of wiring grooves is formed is formed on the insulating film 58. At this time, in order to protect the insulating film 56, the resist mask 61 is also made to remain in the insides of the via-holes 60. Next, using the resist mask 61 as a mask, wiring grooves 63 are formed by an anisotropic etching of the insulating film 58.

Figure 4D:
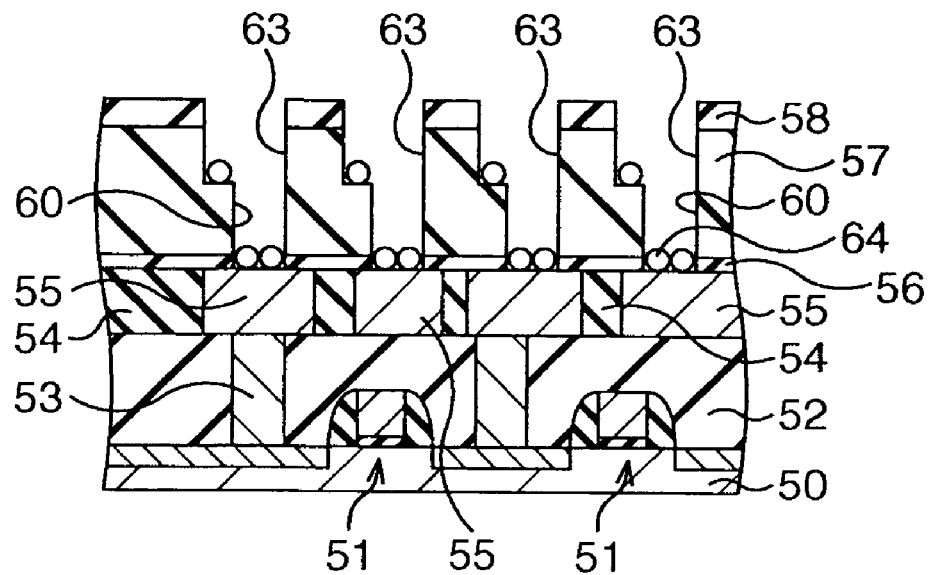

Then, as shown in FIG. 4D, the resist mask 61 is removed by ashing using a gas containing oxygen radicals. After that, the exposed part of the insulating film 56 is removed by an anisotropic etching. As a result, adhered matters 64 occur on the bottoms of the via-holes 60 and the wiring grooves 63.

Subsequently, using a cleaning apparatus of a semiconductor substrate according to the first embodiment, a liquid chemical treatment, a water cleaning treatment and a drying treatment are performed as post-treatments. Moreover, after finished the liquid chemical treatment, the nozzle 1 is cleaned in preparation for the treatment of the subsequent semiconductor substrate.

Figure 4E:
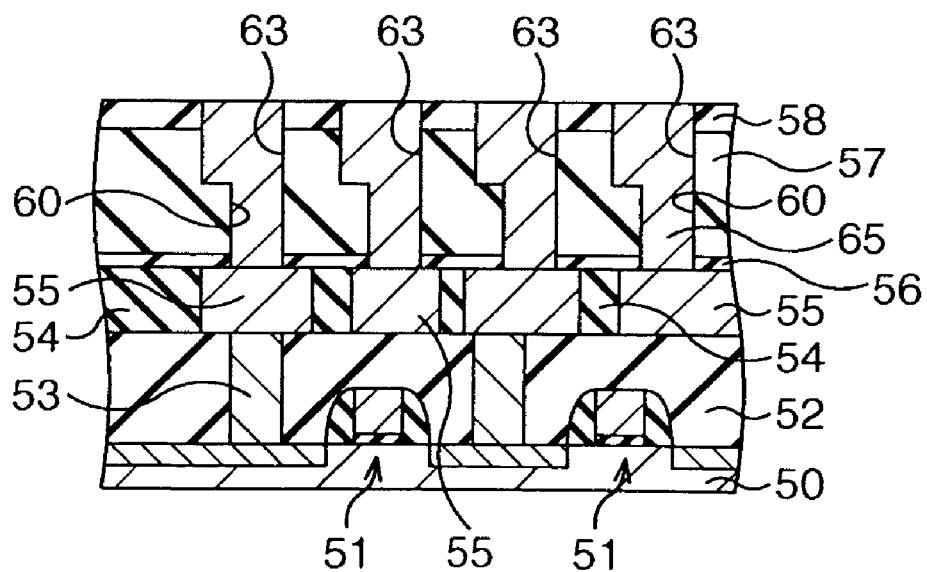

Then, after the liquid chemical treatment, the water cleaning treatment and the drying treatment are finished, as shown in FIG. 4E, conductive materials 65 are buried in the insides of the via-holes 60 and the wiring grooves 63 as via-plugs and wirings. When the conductive material 65 is buried, for example, after a glue film with a thickness of about 50 nm is formed, a Cu film with a thickness of about 300 nm is formed, and the films are flattened. In this manner, wirings are formed by a damascene process.

After that, in a similar manner, a multi-layer wiring is formed by a damascene process to complete a semiconductor device.

FIGS. 5A to 5F are sectional views showing a second method of manufacturing a semiconductor device in the order of steps.

Figure 5A:
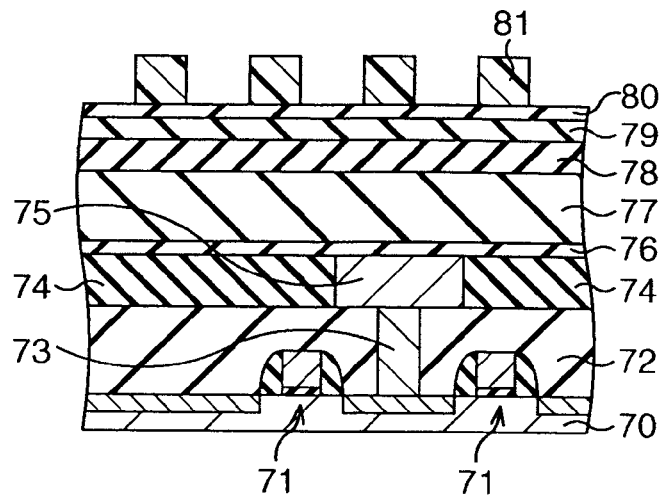
FIGS. 5A to 5F are sectional views showing a second method of manufacturing a semiconductor device in the order of steps.

In the second manufacturing method, first, after an isolation insulating film and a well (not shown in the drawings) are formed, as shown in FIG. 5A, MOS transistors 71 with a LDD structure are formed. Next, an interlayer insulating film 72 covering the MOS transistors 71 is formed. Then, contact holes extending to the source/drain regions and the like of the MOS transistors 71 are formed in the interlayer insulating film 72, and contact plugs 73 are formed in the contact holes. After that, an insulating film 74 is formed on the interlayer insulating film 72 and the contact plugs 73, and buried wirings 75 are formed in the insulating film 74. Next, an insulating film 76, an insulating film 77, a low dielectric constant film 78, an insulating film 79, and an insulating film 80 are sequentially formed on the insulating film 74 and the wirings 75. As the low dielectric constant film 78, for example, a porous silica film or the like is formed. Then, a resist mask 81 to which a pattern of wiring grooves is formed is formed on the insulating film 80.

Figure 5B:
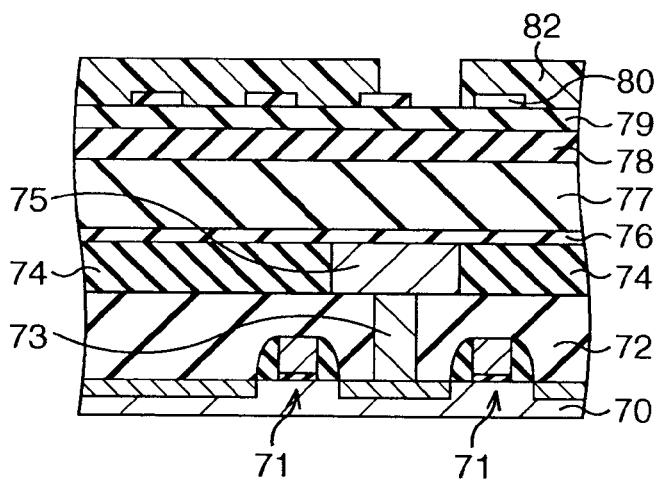

Subsequently, using the resist mask 81 as a mask, and the insulating film 79 as an etching stopper, a pattern of the wiring grooves is formed in the insulating film 80 by an anisotropic etching of the insulating film 80, as shown in FIG. 5B. After that, the resist mask 81 is removed by ashing using a gas containing oxygen radicals. Subsequently, a resist mask 82 to which a pattern of via-holes is formed is formed on the insulating films 79 and 80. In addition, after the resist mask 81 is removed, using the cleaning apparatus of a semiconductor substrate according to the first embodiment, a liquid chemical treatment, a water cleaning treatment and a drying treatment may be performed as post-treatments. In this case, after the liquid chemical treatment is finished, the nozzle 1 is cleaned in preparation for the treatment of the subsequent semiconductor substrate.

Figure 5C:
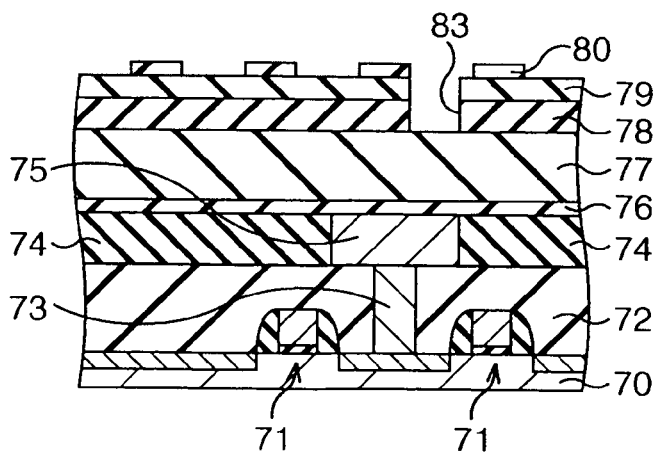

Next, as shown in FIG. 5C, using the resist mask 82 and the insulating film 80 as a mask, and the insulating film 77 as an etching stopper, by an anisotropic etching of the insulating film 79 and the low dielectric film 78, holes 73 are formed as a pattern of via-holes in the insulating film 79 and the low dielectric film 78. At this time, the resist mask 82 is also removed simultaneously.

Figure 5D:
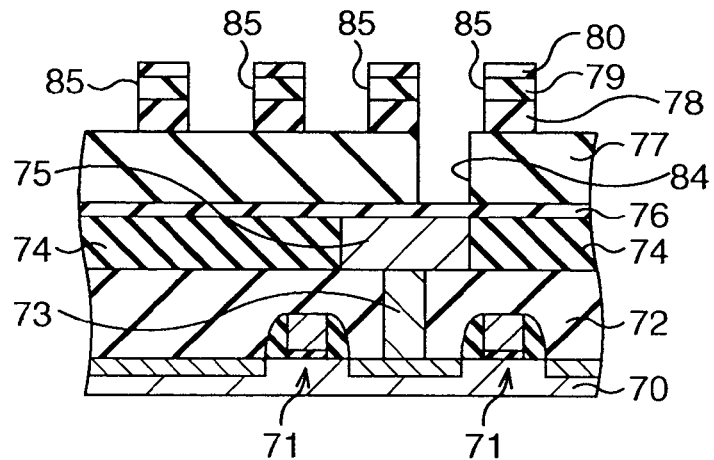

Further, as shown in FIG. 5D, using the insulating film 80 as a mask, by an anisotropic etching of the insulating film 79 and the low dielectric film 78, wiring grooves 85 are formed in the insulating film 79 and the low dielectric constant film 78, as well as, using the insulating film 76 as an etching stopper, by an anisotropic etching of the insulating film 77, via-holes 74 are formed.

Figure 5E:
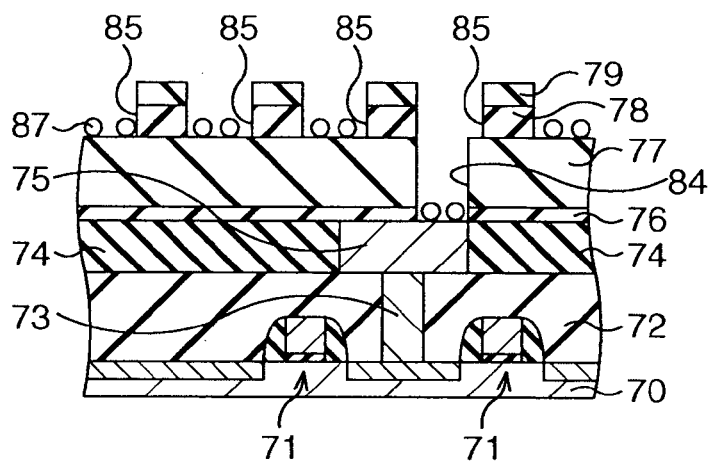

Next, as shown in FIG. 5E, by an anisotropic etching, the insulating film 80 and the exposed part of the insulating film 76 are removed. As a result, adhered matters 87 occur on the bottoms of the via-holes 84 and the wiring grooves 85.

Subsequently, using the cleaning apparatus of a semiconductor substrate according to the first embodiment, a liquid chemical treatment, a water cleaning treatment and a drying treatment are performed as post-treatments. Moreover, after the liquid chemical treatment is finished, the nozzle 1 is cleaned in preparation for the treatment of the subsequent semiconductor substrate.

Figure 5F:
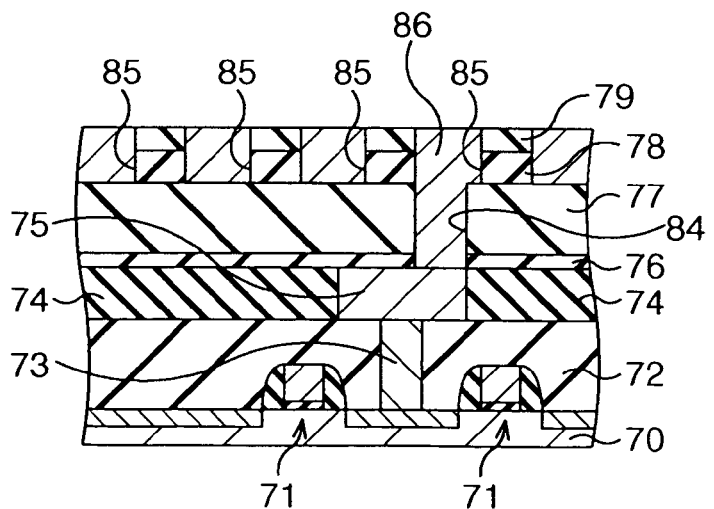

Then, after the liquid chemical treatment, the water cleaning treatment and the drying treatment are finished, as shown in FIG. 5F, conductive materials 86 are buried in the insides of the via-holes 84 and the wiring grooves 85 as via-plugs and wirings. When the conductive material 86 is buried, for example, after a glue film with a thickness of about 50 nm is formed, a Cu film with a thickness of about 300 nm is formed, and the films are flattened. In this manner, wirings are formed by a damascene process.

After that, in a similar manner, a multi-layer wiring is formed by a damascene process to complete a semiconductor device.

In addition, the reason that the cleaning of the outer surface of the nozzle 1 is performed in parallel with the water cleaning treatment and the drying treatment is to start the post treatment of the subsequent substrate 9 without delay so as to obtain high throughput. However, if such a requirement is not present, the cleaning of the outer surface of the nozzle 1 should not necessarily be performed in parallel with the water cleaning treatment and the drying treatment.

Second Embodiment

Figure 6:
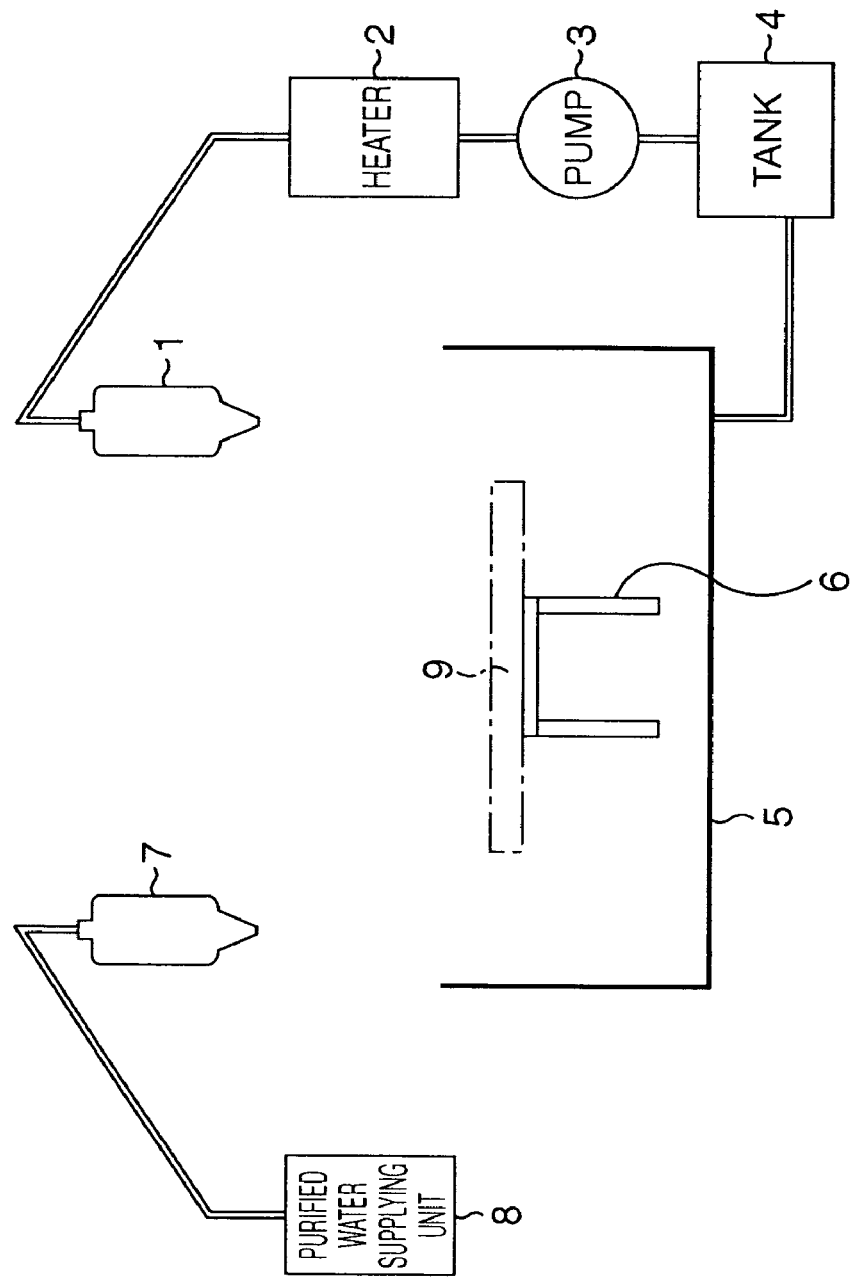
FIG. 6 is a schematic view showing a cleaning apparatus of a semiconductor substrate according to a second embodiment of the present invention.

Next, a second embodiment of the present invention will be described. FIG. 6 is a schematic view showing a cleaning apparatus of a semiconductor device according to the second embodiment of the present invention. The second embodiment differs from the first embodiment in that a unit for cleaning the outer surface of the nozzle 1 is not provided. In other words, the cleaning line 10, the drain line 11, the nozzle cleaning bath 12, and the nozzle 13 in the first embodiment are not provided.

Figure 7:
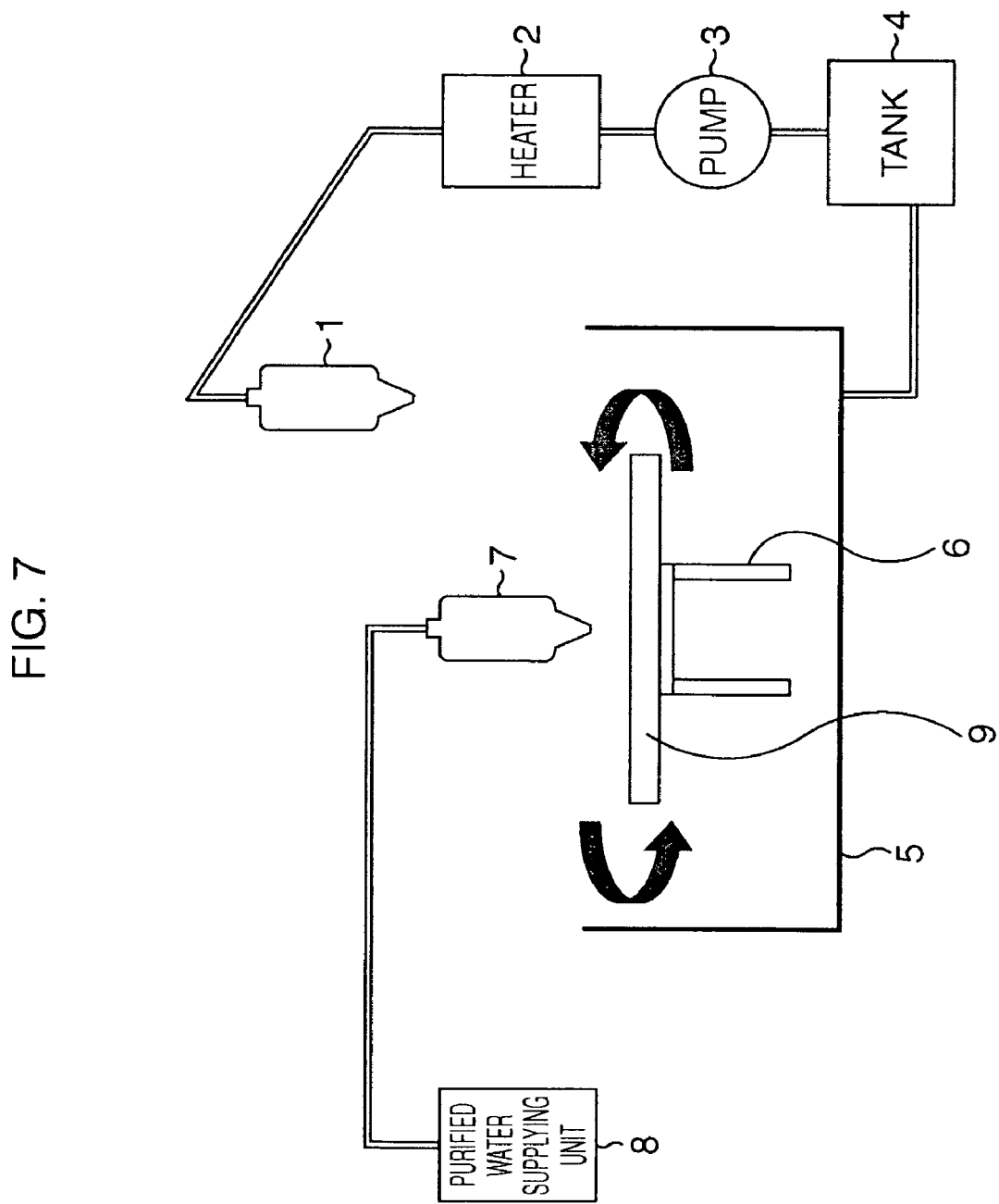
FIG. 7 is a schematic view showing an operation of the cleaning apparatus of a semiconductor substrate according to the second embodiment.
Figure 9:
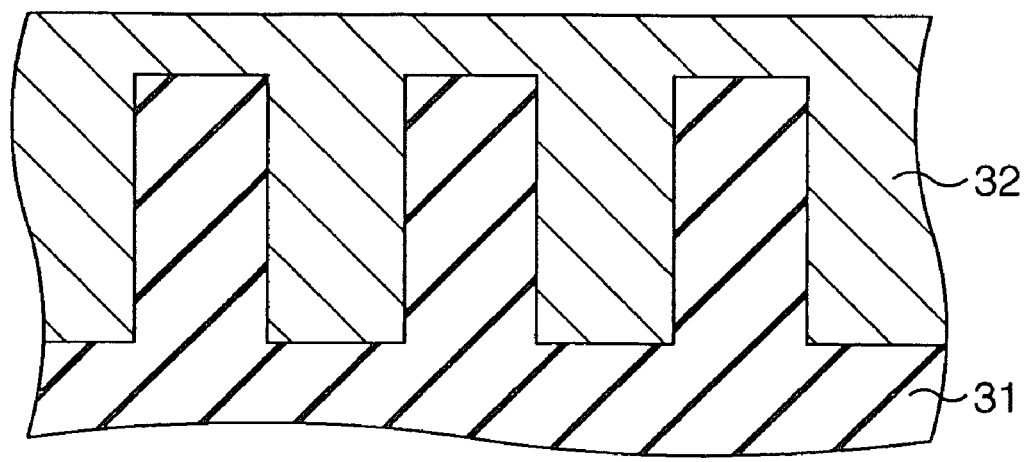
FIG. 9 is a view showing a liquid film formed on a surface of a semiconductor substrate.

In the cleaning of a semiconductor device using the apparatus, first, as shown in FIG. 7, the substrate 9 to whose insulating film (for example, a low dielectric constant film) dry-etching and the like has been performed is placed on the stage 6. Next, the nozzle 7 for purified water is moved above the substrate 9. Then, while the substrate 9 is rotated, the purified water is made to spray from the purified water supplying unit 8 to the surface of the substrate 9 via the nozzle 7. As for the spraying time, it is set to, for example, about ten seconds. As a result, as shown in FIG. 9, purified water wets over the surface of an insulating film 31 in which wiring grooves and the like are formed, thereby, the insulating film 31 is covered with a liquid film 32 of purified water.

Figure 8:
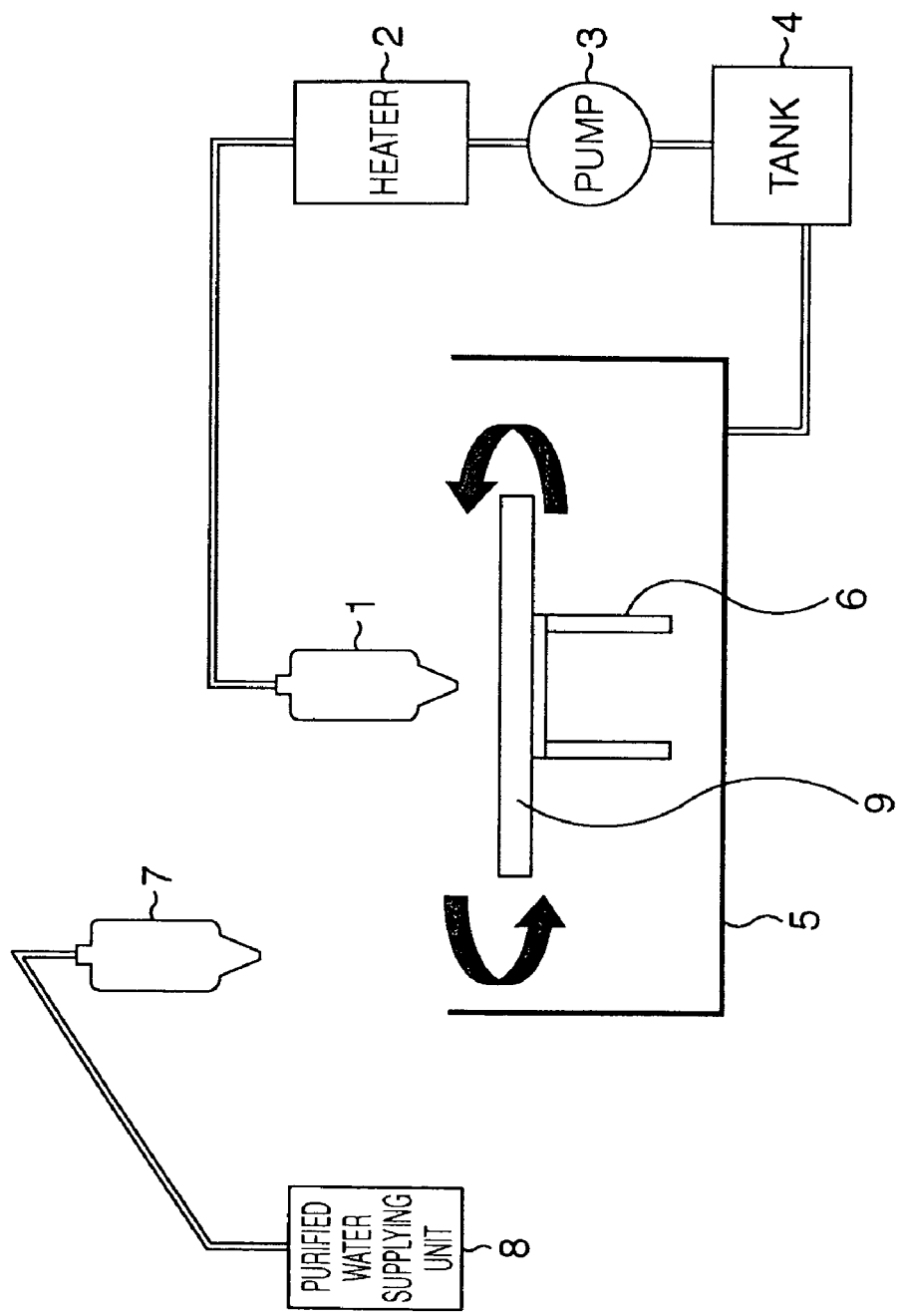
FIG. 8 is a schematic view showing an operation of the cleaning apparatus of a semiconductor substrate following the operation in FIG. 7.

Next, as shown in FIG. 8, the nozzle 7 for purified water is returned, and the nozzle 1 for the liquid chemical is moved above the substrate 9. Then, while the substrate 9 is rotated, the liquid chemical in the tank 4 for cleaning a substrate is sprayed from the nozzle 1 to the surface of the substrate 9 via the pump 3 and the heater 2. As the liquid chemical, for example, an ammonium fluoride-based liquid chemical or an ammonium phosphate-based liquid chemical is used. Moreover, a liquid chemical containing one or more species of amines selected from a primary amine to a quaternary amine containing ammonium fluoride or ammonium phosphate may be used in stead. In the liquid chemical treatment, for example, a temperature of the liquid chemical is set to 25° C. to 80° C., and a spraying time of the liquid chemical is set to 30 seconds to 180 seconds.

By the rotation of the substrate 9 and the spraying of the liquid chemical, the adhered matters and the like present on the surface of the substrate 9 are removed. At this time, adhered matters and the like may drop from the outside of the nozzle 1 on the substrate 9. However, in the present embodiment, since the liquid film 32 is formed before the liquid chemical treatment, even if the adhered matters and the like drop on the insulating film 31 and the like, the liquid film 32 acts as a buffer layer, thereby, causing a force applying to the insulating film 31 and the like to be weak. Therefore, the deformation of the insulating film 31 and the like is suppressed.

Subsequently, the nozzle 1 for the liquid chemical is returned, and the nozzle 7 for purified water is moved above the substrate 9 again. Then, while the substrate 9 is rotated, purified water is made to spray from the purified water supplying unit 8 to the surface of the substrate via the nozzle 7. In the water cleaning treatment, for example, a water temperature is set to a room temperature, and a spraying time of purified water is set to about 60 seconds.

By the rotation of the substrate 9 and the spraying of the purified water, the liquid chemical remaining on the substrate 9 is washed away.

After that, the substrate 9 is dried for about 20 seconds, for example.

Subsequently, the substrate 9 is taken out from the stage 6, then, another substrate to be cleaned subsequently is placed on the stage 6. Then, until the cleaning of all of the substrates 9 are finished, the liquid chemical treatment, the water cleaning treatment and the drying treatment are repeated.

According to the second embodiment, due to the presence of the liquid film 32, the deformation of the pattern and the like already formed can be suppressed. Therefore, the occurrence of defective products accompanied with the drop of the adhered matters can be suppressed.

Third Embodiment

Figure 10:
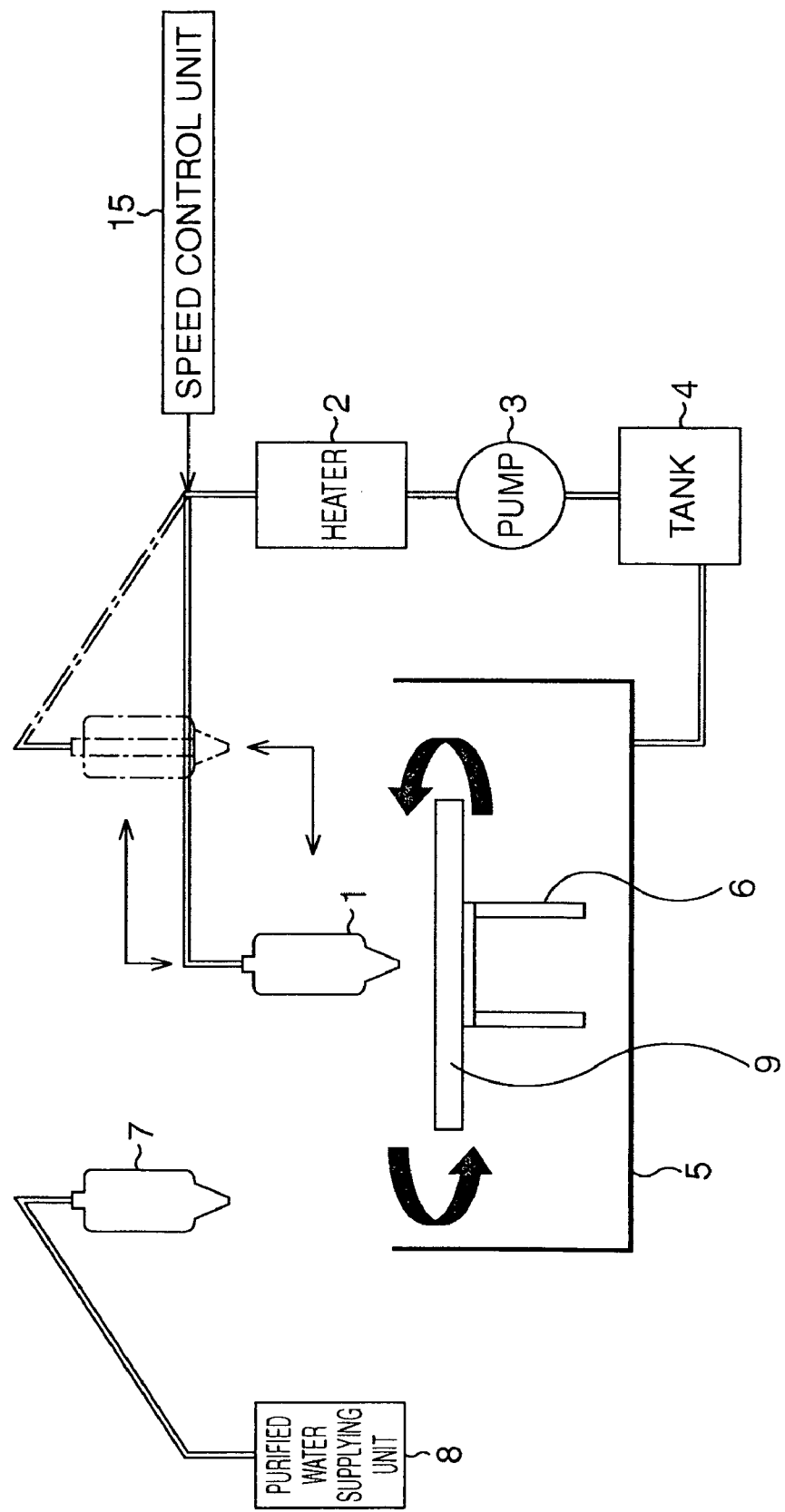
FIG. 10 is a schematic view showing a cleaning apparatus of a semiconductor substrate used in a third embodiment of the present invention.

Next, a third embodiment of the present invention will be described. FIG. 10 is a schematic view showing a cleaning apparatus of a semiconductor device used in the third embodiment of the present invention. The third embodiment differs from the second embodiment in that a speed limiting unit 15 limiting a moving speed of the nozzle 1 for a liquid chemical via an arm is provided. The speed limiting unit 15 limits the moving speed of the nozzle 1 to 2 cm/second or less.

In the cleaning of a semiconductor device using the apparatus, first, as shown in FIG. 10, the substrate to whose insulating film (for example, a low dielectric constant film) dry-etching and the like has been performed is placed on the stage 6. Next, the nozzle 1 for the liquid chemical is moved above the substrate 9. At this time, the speed limiting unit 15 limits the moving speed of the nozzle 1 to 2 cm/second or less. Then, while the substrate 9 is rotated, the liquid chemical in the tank 4 is sprayed from the nozzle 1 to the surface of the substrate 9 via the pump 3 and the heater 2. As the liquid chemical, for example, an ammonium fluoride-based liquid chemical or an ammonium phosphate-based liquid chemical is used. Moreover, a liquid chemical containing one or more species of amines selected from a primary amine to a quaternary amine containing ammonium fluoride or ammonium phosphate may be used in stead. In the liquid chemical treatment, for example, a temperature of the liquid chemical is set to 25° C. to 80° C., and a spraying time of the liquid chemical is set to 30 seconds to 180 seconds.

By the rotation of the substrate 9 and the spraying of the liquid chemical, the adhered matters and the like present on the surface of the substrate 9 are removed. At this time, as mentioned above, the liquid chemical and the like sprayed to the substrate 9 is scattered on the outer surface of the nozzle 1, thereby, resulting in crystallization of their components.

Next, the nozzle 1 for the liquid chemical is returned, and the nozzle 7 for purified water is moved above the substrate 9. At this time, the speed limiting unit 15 also limits the moving speed of the nozzle 1 to 2 cm/second or less. Then, while the substrate 9 is rotated, purified water is sprayed from the purified water supplying unit 8 to the surface of the substrate via the nozzle 7. In the water cleaning treatment, for example, a water temperature is set to a room temperature, and a spraying time of purified water is set to about 60 seconds.

By the rotation of the substrate 9 and the spraying of the purified water, the liquid chemical remaining on the substrate 9 is washed away.

After that, the substrate 9 is dried for about 20 seconds, for example.

Subsequently, the substrate 9 is taken out from the stage 6, and another substrate to be cleaned subsequently is placed on the stage 6. Then, until the cleaning of all of the substrates 9 are finished, the liquid chemical treatment, the water cleaning treatment and the drying treatment are repeated.

According to the third embodiment, since the moving speed of the nozzle 1 is limited, a vibration of the nozzle 1 is suppressed. Thus, even if adhered matters occur on the outer surface of the nozzle 1, a frequency of the drop is reduced, thereby enabling to suppress the occurrence of defective products accompanied by the drop of the adhered matters.

However, if the moving speed of the nozzle 1 is limited too much, throughput is reduced extremely. Therefore, it is preferable for the moving speed of the nozzle 1 is set to 0.5 cm/second to 2 cm/second. Moreover, as shown by an arrow in FIG. 10, as for the moving direction of the nozzle 1, the nozzle may be moved first in either direction of the horizontal direction or the perpendicular direction, but, in either direction, the moving speed is required to be limited.

In addition, these embodiments may also be combined appropriately. For example, the cleaning of the outer surface of the nozzle 1 and the limitation of the moving speed of the nozzle 1 may also be combined. Moreover, the formation of the liquid film 32 and the limitation of the moving speed of the nozzle 1 may also be combined. Further, the cleaning of the nozzle 1 and the formation of the liquid film 32 may also be combined.

Moreover, in these embodiments, one arm is provided with one nozzle, however, one arm may be provided with plural nozzles for liquid chemicals, or one arm is provided with a nozzle for a liquid chemical and a nozzle for purified water.

Here, the result of a test practically implemented by the inventor of the present invention will be described. In the test, first, using a conventional apparatus, the nozzle 101 for a liquid chemical was repeatedly moved by 10 times with respect to a large diameter (300 nm) semiconductor substrate, after that, if the damage in the semiconductor substrate was present or not was observed. Moreover, according to the first embodiment of the present invention, the nozzle 1 for the liquid chemical was also repeatedly moved by 10 times with respect to a similar large diameter semiconductor substrate. Then, if the damage was present or not was observed. These results are shown in FIGS. 11A and 11B, respectively.

Figure 11A:
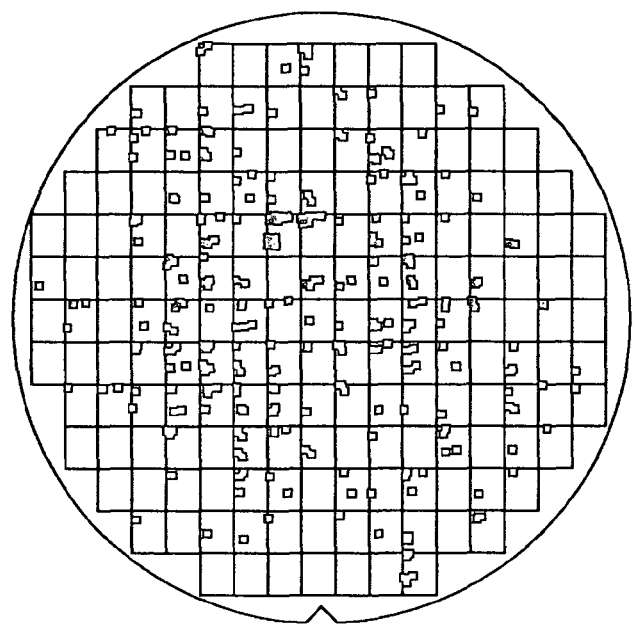
FIG. 11A is a view showing a result of cleaning using a conventional cleaning apparatus.
Figure 11B:
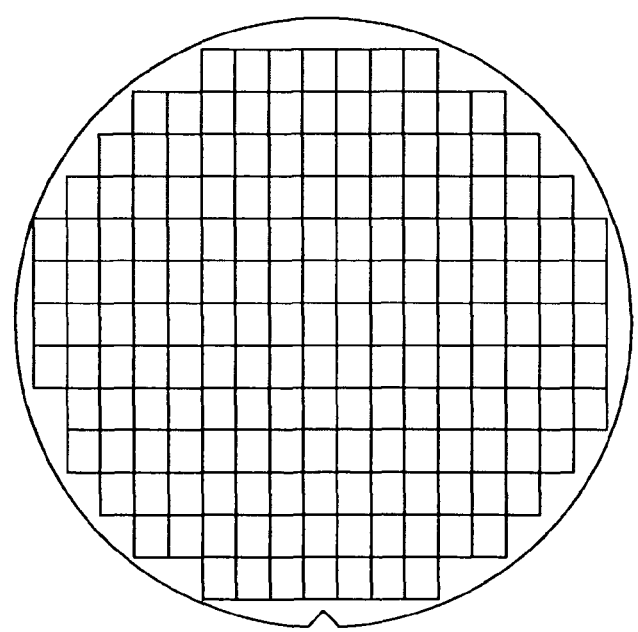
FIG. 11B is a view showing a result of cleaning using the cleaning apparatus according to the first embodiment.
Figure 12:
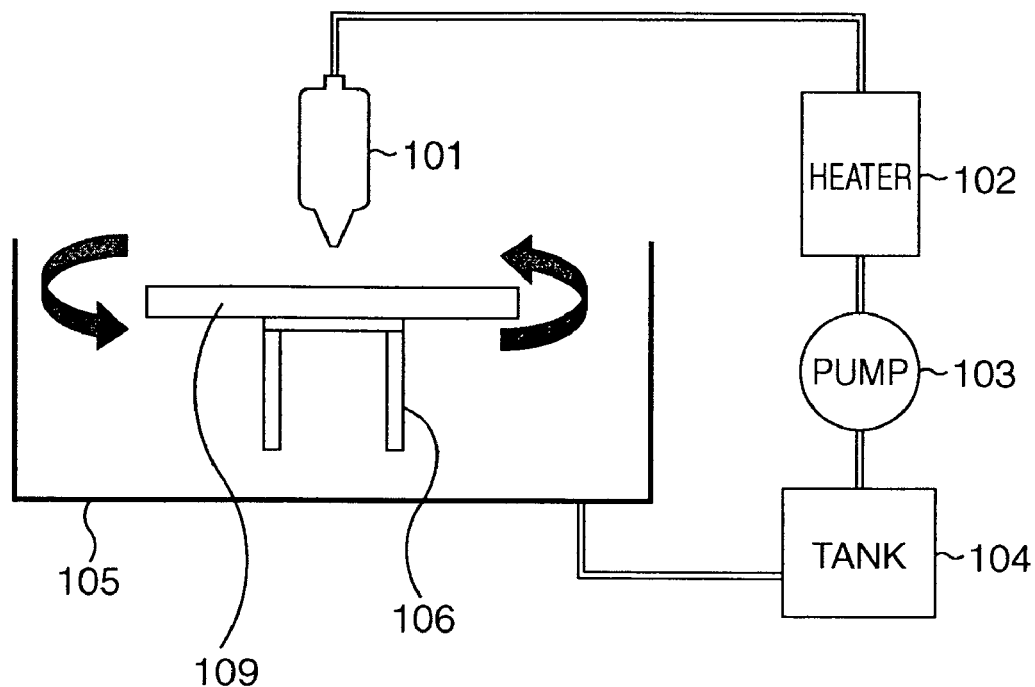
FIG. 12 is a schematic view showing a conventional single-wafer-type post-treating apparatus.
Figure 13:
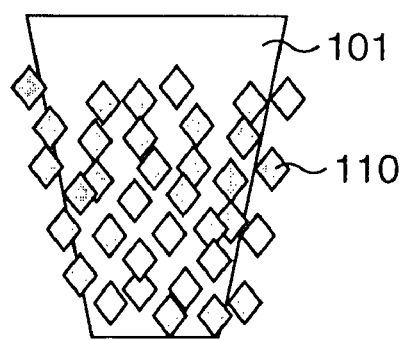
FIG. 13 is a view showing a nozzle for a liquid chemical after used.
Figure 14A:
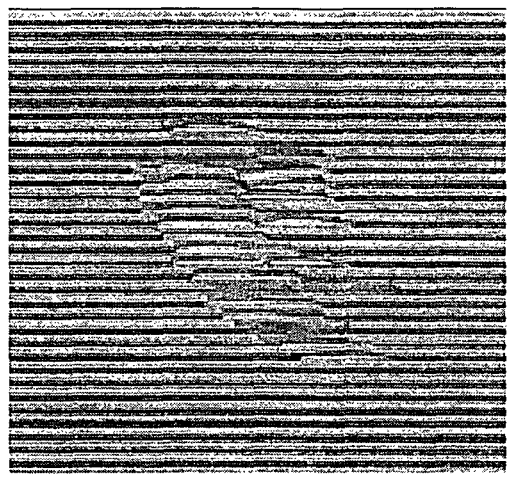
FIG. 14A is a view showing a photograph by an electron microscope that shows deformation of a low dielectric constant film.
Figure 14B:
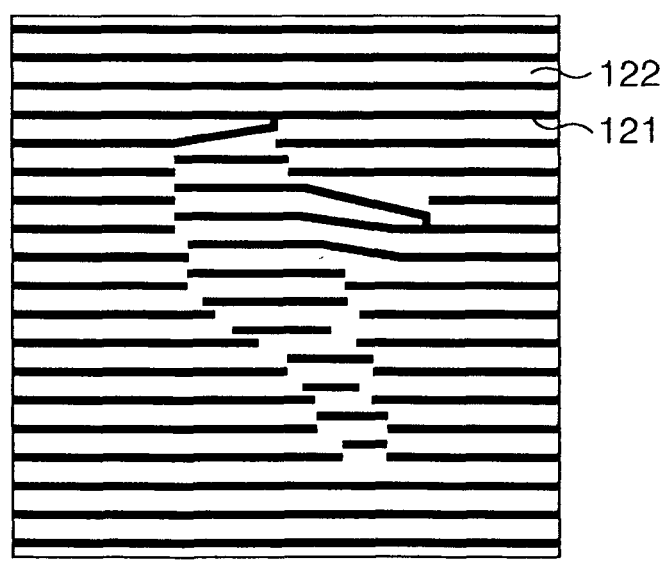
FIG. 14B is a view schematically showing the content of FIG. 14A.

As shown in FIG. 11A, in the case of using a conventional apparatus, many drops of adhered matters occurred, thereby much damage was observed. On the contrary, in the case of the post treatment according to the first embodiment, no damage was observed, as shown in FIG. 11B.

It should be noted that, in Patent document 1, a technology for preventing the occurrence of dusting of particles from the inner surface of a cleaning nozzle is disclosed, however, no description concerning the affect of the materials adhered on the outer surface of the nozzle to the defective products of semiconductor devices is present.

Moreover, in Patent documents 2 and 3, a technology for suppressing the contamination of the tip of a nozzle used when forming a coating film is disclosed, however, no description concerning the affect of the materials adhered on the outer surface of the nozzle to the defective products of semiconductor devices is present.

According to the present invention, the drop of adhered matters can be suppressed or the impact of the drop can be alleviated. Therefore, the deformation of an insulating film and the like accompanied with the drop of adhered matters can be suppressed, thereby, resulting in high yields.

What is claimed is:

1. A method of manufacturing a semiconductor device comprising:
   supplying a liquid chemical from a first nozzle to a semiconductor substrate at a position above a treating bath;
   transferring the first nozzle to above a nozzle cleaning bath arranged at a position apart from the treating bath after supplying the liquid chemical;
   removing materials adhered on an outside of said first nozzle by supplying a cleaning liquid from a second nozzle to said materials at a position above the nozzle cleaning bath;
   washing away the liquid chemical remaining on the semiconductor substrate by supplying water from a third nozzle at a position above the treating bath; and
   drying the semiconductor substrate at a position above the treating bath,
   wherein at least one of washing away the liquid chemical or drying the semiconductor substrate is performed while the first nozzle is located above the nozzle cleaning bath.

2. The method of manufacturing a semiconductor device according to claim 1, wherein purified water is used as said cleaning liquid.

3. The method of manufacturing a semiconductor device according to claim 1, further comprising, before supplying said liquid chemical, forming a liquid film on a surface of said semiconductor substrate.

4. The method of manufacturing a semiconductor device according to claim 3, wherein a film of purified water is formed as said liquid film.

5. The method of manufacturing a semiconductor device according to claim 1, further comprising limiting a moving speed of said nozzle for a liquid chemical to 2 cm/second or less.

6. The method of manufacturing a semiconductor device according to claim 1, wherein, as said liquid chemical, one containing ammonium fluoride or ammonium phosphate is used.

7. The method of manufacturing a semiconductor device according to claim 1, wherein a diameter of said semiconductor substrate is 300 mm or more.

8. The method of manufacturing a semiconductor device according to claim 1, wherein a pattern of an insulating film having specific dielectric constant of 3.0 or less and Young's modulus of 20 GPa or less is formed on a surface of said semiconductor substrate.

9. The method of manufacturing a semiconductor device according to claim 1, wherein the washing away the liquid chemical is performed by rotation of the semiconductor substrate and spraying purified water.

10. The method of manufacturing a semiconductor device according to claim 1, further comprising transferring the third nozzle to above the treating bath after the supplying the liquid chemical.

11. The method of manufacturing a semiconductor device according to claim 1, wherein a tip of the first nozzle is located at first height, and a tip of the second nozzle is located at second height higher than the first height.

* * * * *